United States Patent
Sherpa et al.

(10) Patent No.: US 10,431,470 B2
(45) Date of Patent: *Oct. 1, 2019

(54) METHOD OF QUASI-ATOMIC LAYER ETCHING OF SILICON NITRIDE

(71) Applicant: Tokyo Electron Limited, Minato-ku, Tokyo (JP)

(72) Inventors: Sonam D. Sherpa, Albany, NY (US); Alok Ranjan, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/904,144

(22) Filed: Feb. 23, 2018

(65) Prior Publication Data
US 2018/0277385 A1    Sep. 27, 2018

Related U.S. Application Data

(60) Provisional application No. 62/462,764, filed on Feb. 23, 2017.

(51) Int. Cl.
| | | |
|---|---|---|
| *H01L 21/3065* | (2006.01) | |
| *H01L 21/033* | (2006.01) | |
| *H01L 21/311* | (2006.01) | |
| *H01L 21/308* | (2006.01) | |
| *H01L 21/3213* | (2006.01) | |

(52) U.S. Cl.
CPC ...... *H01L 21/3065* (2013.01); *H01L 21/0337* (2013.01); *H01L 21/0338* (2013.01); *H01L 21/3086* (2013.01); *H01L 21/3088* (2013.01); *H01L 21/311* (2013.01);
(Continued)

(58) Field of Classification Search
None
See application file for complete search history.

(56) References Cited

U.S. PATENT DOCUMENTS

| 4,529,476 A | 7/1985 | Kawamoto et al. |
| 6,194,037 B1 | 2/2001 | Terasaki et al. |
| (Continued) | | |

FOREIGN PATENT DOCUMENTS

JP    5706946 B2    4/2015

OTHER PUBLICATIONS

International Search Report and Written Opinion dated May 23, 2018 in PCT/US2018/019551 (10 pages).
(Continued)

*Primary Examiner* — Jiong-Ping Lu
(74) *Attorney, Agent, or Firm* — Rothwell, Figg, Ernst & Manbeck, P.C.

(57) ABSTRACT

A method of etching is described. The method includes providing a substrate having a first material containing silicon nitride and a second material that is different from the first material, forming a first chemical mixture by plasma-excitation of a first process gas containing H and optionally a noble gas, and exposing the first material on the substrate to the first chemical mixture. Thereafter, the method includes forming a second chemical mixture by plasma-excitation of a second process gas containing S and F, and optionally a noble element, and exposing the first material on the substrate to the second plasma-excited process gas to selectively etch the first material relative to the second material.

19 Claims, 5 Drawing Sheets

(52) U.S. Cl.
CPC .. *H01L 21/31116* (2013.01); *H01L 21/31144* (2013.01); *H01L 21/3213* (2013.01); *H01L 21/32137* (2013.01)

(56) References Cited

U.S. PATENT DOCUMENTS

| | | | |
|---|---|---|---|
| 7,709,396 | B2 | 5/2010 | Bencher et al. |
| 7,977,249 | B1 * | 7/2011 | Liu .................. H01L 21/31111 216/79 |
| 8,980,758 | B1 | 3/2015 | Ling et al. |
| 9,257,293 | B2 | 2/2016 | Posseme et al. |
| 9,324,572 | B2 | 4/2016 | Sasaki et al. |
| 9,384,997 | B2 | 7/2016 | Ren et al. |
| 10,043,890 | B2 | 8/2018 | Pollet et al. |
| 2002/0003126 | A1 | 1/2002 | Kumar et al. |
| 2003/0207585 | A1 * | 11/2003 | Choi ................ H01L 21/31116 438/723 |
| 2007/0048950 | A1 | 3/2007 | Kanakasabapathy et al. |
| 2008/0070165 | A1 | 3/2008 | Fischer |
| 2008/0076071 | A1 | 3/2008 | Lim et al. |
| 2009/0047447 | A1 | 2/2009 | Sawin et al. |
| 2009/0091037 | A1 | 4/2009 | Assefa et al. |
| 2011/0318936 | A1 | 12/2011 | Ko et al. |
| 2013/0029494 | A1 | 1/2013 | Sasaki et al. |
| 2013/0052827 | A1 * | 2/2013 | Wang ................ H01J 37/32357 438/694 |
| 2013/0164940 | A1 | 6/2013 | Raley et al. |
| 2014/0054269 | A1 | 2/2014 | Hudson et al. |
| 2014/0187046 | A1 | 7/2014 | Posseme et al. |
| 2014/0242803 | A1 | 8/2014 | Hibino et al. |
| 2015/0243485 | A1 | 8/2015 | Baujon et al. |
| 2016/0104648 | A1 | 4/2016 | Park et al. |
| 2016/0247680 | A1 | 8/2016 | O'Meara et al. |
| 2016/0247688 | A1 | 8/2016 | Zhu et al. |
| 2016/0343579 | A1 | 11/2016 | Peng et al. |
| 2017/0084720 | A1 | 3/2017 | Pollet et al. |
| 2017/0345667 | A1 | 11/2017 | Sherpa et al. |
| 2017/0345671 | A1 | 11/2017 | Ranjan et al. |
| 2017/0345674 | A1 | 11/2017 | Ranjan et al. |
| 2018/0012766 | A1 | 1/2018 | Pollet et al. |
| 2018/0166303 | A1 | 6/2018 | Tabata et al. |

OTHER PUBLICATIONS

International Search Report and Written Opinion dated Dec. 5, 2017, in PCT/US2017/048600 (9 pages).
U.S. Office Action dated Sep. 13, 2018, in co-pending U.S. Appl. No. 15/686,546, filed Aug. 25, 2017 (22 pages).
U.S. Office Action dated Sep. 13, 2018, in co-pending U.S. Appl. No. 15/910,508, filed Mar. 2, 2018 (20 pages).

* cited by examiner

METHOD OF QUASI-ATOMIC LAYER ETCHING OF SILICON NITRIDE

CROSS REFERENCE TO RELATED APPLICATIONS

The present application claims the benefit of U.S. Provisional Patent Application No. 62/462,764, filed on Feb. 23, 2017, entitled "METHOD OF QUASI-ATOMIC LAYER ETCHING OF SILICON NITRIDE" which is incorporated herein by reference in its entirety.

FIELD OF INVENTION

The invention relates to a method for etching, and more particularly, a precision etch technique for etching a thin film for electronic device applications.

BACKGROUND OF THE INVENTION

The present invention relates to a method of manufacturing a semiconductor device such as an integrated circuit and transistors and transistor components for an integrated circuit. In the manufacture of a semiconductor device (especially on the microscopic scale), various fabrication processes are executed such as film-forming depositions, etch mask creation, patterning, material etching and removal, and doping treatments, are performed repeatedly to form desired semiconductor device elements on a substrate. Historically, with microfabrication, transistors have been created in one plane, with wiring/metallization formed above, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor devices in which transistors are stacked on top of each other.

As device structures densify and develop vertically, the need for precision material etch becomes more compelling. Trade-offs between selectivity, profile, ARDE (aspect ratio dependent etching), and uniformity in plasma etch processes become difficult to manage. Current approaches to patterning and pattern transfer by balancing these trade-offs is not sustainable. The root cause for these trade-offs is the inability to control ion energy, ion flux, and radical flux independently. However, self-limiting processes, such as atomic layer etching (ALE), offer a viable route to escape these trade-offs by decoupling the etch process into sequential steps of surface modification and removal of modified surface regions, thereby allowing the segregation of the roles of radical flux and ion flux and energy.

SUMMARY

Techniques herein pertain to device fabrication using precision etch techniques.

A method of etching is described. The method includes providing a substrate having a first material containing silicon nitride and a second material that is different from the first material, forming a first chemical mixture by plasma-excitation of a first process gas containing H and optionally a noble gas, and exposing the first material on the substrate to the first chemical mixture. Thereafter, the method includes forming a second chemical mixture by plasma-excitation of a second process gas containing S and F, and optionally a noble element, and exposing the first material on the substrate to the second plasma-excited process gas to selectively etch the first material relative to the second material.

Another method of etching is described. The method includes providing a substrate having a first material containing silicon nitride and a second material that is different from the first material, forming a first chemical mixture by plasma-excitation of a first process gas containing H and optionally a noble gas, and exposing the first material on the substrate to the first chemical mixture. Thereafter, the method includes forming a second chemical mixture by plasma-excitation of a second process gas containing a high fluorine content molecule, and optionally a noble element, wherein the ratio of fluorine to other atomic elements of the high fluorine content molecule exceeds unity, and exposing the first material on the substrate to the second plasma-excited process gas to selectively etch the first material relative to the second material.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

DETAILED DESCRIPTION

Techniques herein pertain to device fabrication using precision etch techniques. Several instances manifest in semiconductor manufacturing in both front end of line (FEOL, e.g., transistor fabrication) through to the back end of line (BEOL, e.g., interconnect fabrication), where oxide and nitride films (typically silicon-containing, in nature) need to be etched with a high degree of precision.

Numerous fabrication sequences in semiconductor manufacturing demand precision etch techniques. Examples, which will be discussed later, include: (1) gate spacer etch for both 2D (two-dimensional) and 3D (three-dimensional) device structures, (2) spacer etch for sidewall image transfer (SIT) for multi-patterning, (3) mandrel removal from a post-spacer etch SIT structure, and (4) liner etch from a raised structure.

As another example, fabrication of self-aligned block (SAB) structures has become a critical step in self-aligned double patterning (SADP), self-aligned quadruple patterning (SAQP), and other variations of self-aligned multiple patterning (SAMP). As part of an SAB flow, a silicon nitride mandrel is anisotropically etched with selectivity to an oxide spacer. Current approaches to etch silicon nitride mandrel do not have the required selectivity, which exceeds 15 (i.e., the etch rate of silicon nitride is 15 times greater than the etch rate of silicon oxide) to etch the mandrel without damaging the oxide spacer.

This invention relates to development of an anisotropic process that can etch silicon nitride mandrel with extremely high selectivity (e.g., >15, or >20, or >30, or >50, or >80, and even >100) to oxide spacer, thereby enabling SAB fabrication flows.

Figure 1:
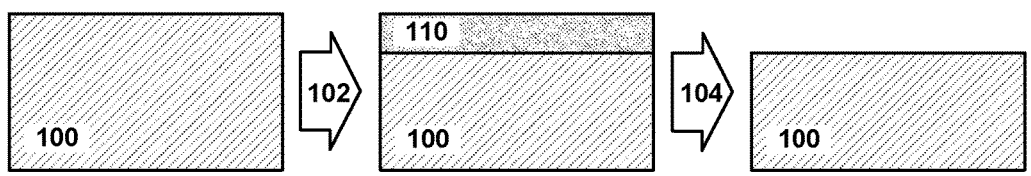
FIG. 1 illustrates a schematic representation of a method of etching a thin film on a substrate according to an embodiment.
Figure 2:
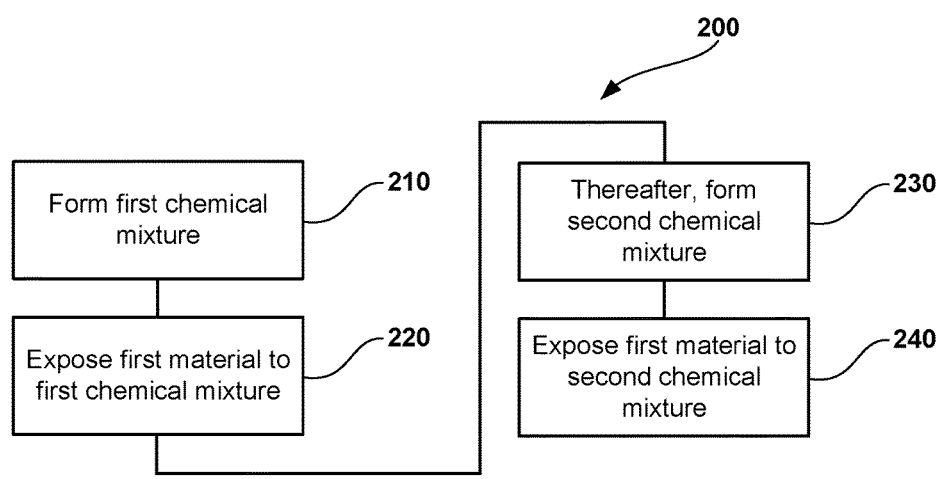
FIG. 2 provides a flow chart illustrating a method of etching a substrate according to an embodiment.

According to several embodiments, FIGS. 1 and 2 illustrate a method of etching a thin film. The method, depicted as flow chart 200, includes providing a substrate having a first material 100 containing silicon nitride and a second material (not shown) that is different from the first material 100, forming a first chemical mixture by plasma-excitation of a first process gas containing H and optionally a noble gas in step 210, and exposing the first material on the substrate to the first chemical mixture in step 220, the combination of which is depicted as 102 in FIG. 1. Thereafter, the method includes forming a second chemical mixture by plasma-excitation of a second process gas containing N, F, and O, and optionally a noble element in step 230, and exposing the first material 100 on the substrate to the second plasma-excited process gas to selectively etch the first material 100 relative to the second material in step 240, the combination of which is depicted as 104 in FIG. 1. Alternatively, the method includes forming a second chemical mixture by plasma-excitation of a second process gas containing S and F, and optionally a noble element in step 230, and exposing the first material 100 on the substrate to the second plasma-excited process gas to selectively etch the first material 100 relative to the second material in step 240, the combination of which is depicted as 104 in FIG. 1.

The first material 100, to be etched, contains, consists essentially of, or consists of silicon nitride, expressed as $Si_3N_4$, or more generically $Si_xN_y$, wherein x and y are real number greater than zero. The second material (not shown) can include silicon oxide, e.g., $SiO_2$, or other silicon-containing material, a metal or metal-containing material, or an organic material, such as an organic planarization layer (OPL), resist, or antireflective coating (ARC).

As set forth above, the first chemical mixture is formed from the plasma excitation of a first process gas. The first process gas contains hydrogen (H), and can include atomic hydrogen (H), molecular hydrogen ($H_2$), metastable hydrogen, hydrogen radical, or hydrogen ions, or any combination of two or more thereof. In one embodiment, the first process gas includes $H_2$, or $H_2$ and Ar. In another embodiment, the first process gas consists essentially of or consists of $H_2$. In yet another embodiment, the first process gas consists essentially of or consists of $H_2$ and Ar.

As also set forth above, the second chemical mixture is formed from the plasma excitation of a second process gas. The second process gas can contain a high fluorine content molecule, wherein the ratio of fluorine to other atomic elements exceeds unity. The second process gas can contain nitrogen (N), fluorine (F), and oxygen (O), and can optionally include a noble element, such as Ar (argon). In one embodiment, the second process gas includes $NF_3$, $O_2$, and Ar. In another embodiment, the second process gas consists essentially of or consists of $NF_3$, $O_2$, and Ar. Alternatively, the second process gas can contain sulfur (S) and fluorine (F), and can optionally include a noble element, such as Ar (argon). In one embodiment, the second process gas includes $SF_6$ and Ar. In another embodiment, the second process gas consists essentially of or consists of $SF_6$ and Ar.

Figures 9A, 9B, 9C, 9D:
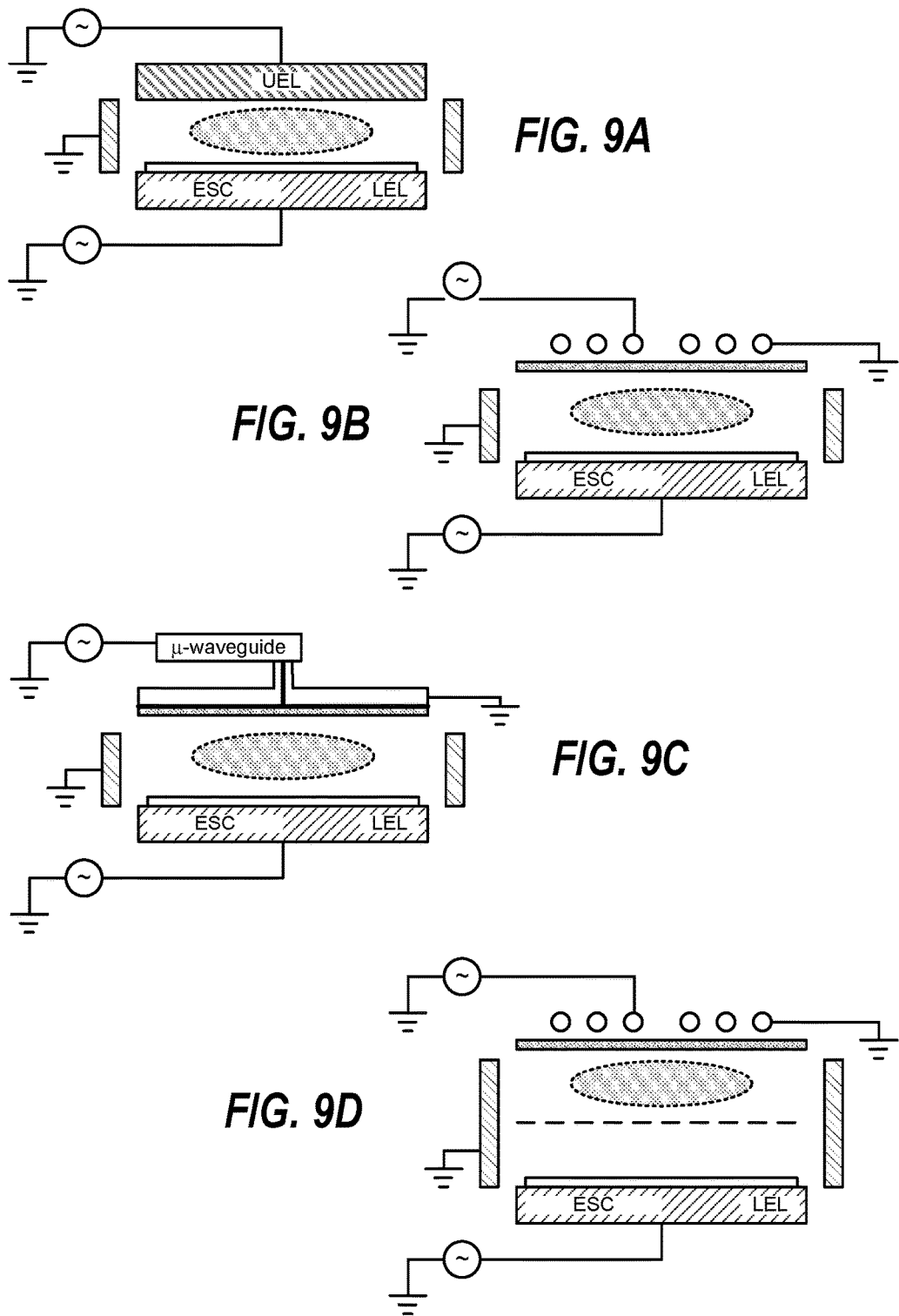
FIGS. 9A through 9D provide schematic illustrations of plasma processing systems for performing the method of etching according to various embodiments.

The plasma-excitation of the first process and/or the second process gas can be performed in-situ (i.e., the first and/or second chemical mixture is formed within a gas-phase, vacuum environment in proximate contact with the substrate), or ex-situ (i.e., the first and/or second chemical mixture is formed within a gas-phase, vacuum environment remotely located relative to the substrate). FIGS. 9A through 9D provide several plasma generating systems that may be used to facilitate plasma-excitation of a process gas. FIG. 9A illustrates a capacitively coupled plasma (CCP) system, wherein plasma is formed proximate a substrate between an upper plate electrode (UEL) and a lower plate electrode (LEL), the lower electrode also serving as an electrostatic chuck (ESC) to support and retain the substrate. Plasma is formed by coupling radio frequency (RF) power to at least one of the electrodes. As shown in FIG. 9A, RF power is coupled to both the upper and lower electrodes, and the power coupling may include differing RF frequencies. Alternatively, multiple RF power sources may be coupled to the same electrode. Moreover, direct current (DC) power may be coupled to the upper electrode.

FIG. 9B illustrates an inductively coupled plasma (ICP) system, wherein plasma is formed proximate a substrate between an inductive element (e.g., a planar, or solenoidal/helical coil) and a lower plate electrode (LEL), the lower electrode also serving as an electrostatic chuck (ESC) to support and retain the substrate. Plasma is formed by coupling radio frequency (RF) power to the inductive coupling element. As shown in FIG. 9B, RF power is coupled to both the inductive element and lower electrode, and the power coupling may include differing RF frequencies.

FIG. 9C illustrates a surface wave plasma (SWP) system, wherein plasma is formed proximate a substrate between a slotted plane antenna and a lower plate electrode (LEL), the lower electrode also serving as an electrostatic chuck (ESC) to support and retain the substrate. Plasma is formed by coupling radio frequency (RF) power at microwave frequencies through a waveguide and coaxial line to the slotted plane antenna. As shown in FIG. 9C, RF power is coupled to both the slotted plane antenna and lower electrode, and the power coupling may include differing RF frequencies.

FIG. 9D illustrates remote plasma system, wherein plasma is formed in a region remote from a substrate and separated from the substrate by a filter arranged to impede the transport of charged particles from the remote plasma source to a processing region proximate the substrate. The substrate is supported by a lower plate electrode (LEL) that also serves as an electrostatic chuck (ESC) to retain the substrate. Plasma is formed by coupling radio frequency (RF) power to a plasma generating device adjacent the remotely located region. As shown in FIG. 9D, RF power is coupled to both the plasma generating device adjacent the remote region and lower electrode, and the power coupling may include differing RF frequencies.

The plasma processing systems of FIGS. 9A through 9D are intended to be illustrative of various techniques for implementing the stepped ion/radical process described. Other embodiments are contemplated including both combinations and variations of the systems described.

When forming the first chemical mixture by plasma-excitation of the first process gas containing H and optionally a noble gas, and exposing the first material on the substrate to the first chemical mixture, the gas pressure for the exposing can be less than or equal to 100 mTorr. For example, the gas pressure may range from 20 mTorr to 100 mTorr. Additionally, the substrate may be electrically biased by coupling RF power to the lower plate electrode (LEL). RF power may or may not also be applied to the plasma generating device.

When forming the second chemical mixture by plasma-excitation of the second process gas containing N, F, and O (or S and F), and optionally a noble gas, and exposing the second material on the substrate to the second chemical mixture, the gas pressure for the exposing can be greater than or equal to 100 mTorr. For example, the gas pressure may range from 100 mTorr to 1000 mTorr. Additionally, the substrate may be electrically biased by coupling RF power to the lower plate electrode (LEL). RF power may or may not also be applied to the plasma generating device.

Figure 3:
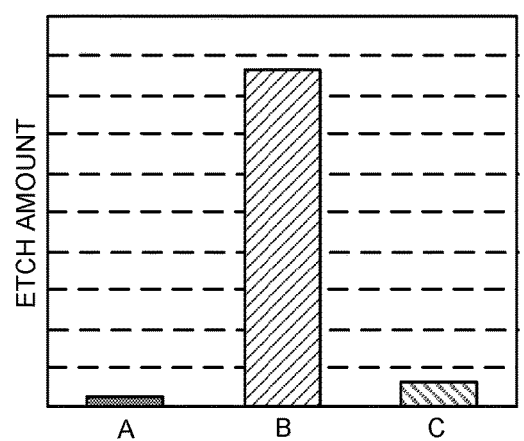
FIG. 3 illustrates a result obtained using the method of etching depicted in FIGS. 1 and 2.

Turning now to FIG. 3 and Table 1, a silicon nitride film, deposited by chemical vapor deposition (CVD) (CVD SiN), is exposed to several etching processes together with an adjacent silicon oxide film. In a first example, the two films are exposed to a hydrogen ($H_2$) plasma only, according to the conditions provided in Table 1. In this ion-driven hydrogen plasma, the two films are not etched and no selectivity between films is observed. In a second example, the two films are exposed to plasma composed of $NF_3$, $O_2$, and Ar. In this radical-driven plasma, eleven (11) Angstroms are etched from the silicon nitride film and only one (1) Angstrom is etched from the silicon oxide film, thus, leading to an etch selectivity of 11-to-1. In a third example, the two films are sequentially exposed to the hydrogen ($H_2$) plasma, and then exposed to the plasma composed of $NF_3$, $O_2$, and Ar. In this ion and radical-driven sequential plasma, sixty one (61) Angstroms are etched from the silicon nitride film and substantially no etching is observed of the silicon oxide film, thus, leading to an etch selectivity exceeding 60-to-1.

TABLE 1

Tool: CCP, ICP, RLSA
H2 plasma: 20-100 mT, HF 0 W,
LF 25-100 W, 500H2/50 Ar, 15C, 15-60 sec
NF3—O2 plasma: 100-500 mT, HF 0-1000 W,
LF 15-100 W, 480NF3/160O2/1000 Ar, 15C, 5-60 sec

| Step | Dominant plasma species | Etch Amount [Å] CVD SiN | Etch Amount [Å] Oxide | Selectivity SiN-Oxide |
|---|---|---|---|---|
| H2 plasma only | Ion-driven | −0.6 | −3 | No sputtering |
| NF3—O2 plasma only | Radical-driven | 11 | 1 | >11 |
| H2 + NF3—O2 plasma | | 61 | −1 | >60 |

In a fourth example, the two films are exposed to plasma composed of $SF_6$ and Ar. In this radical-driven plasma, about twenty (20) Angstroms are etched from the silicon nitride film. In a fifth example, the two films are sequentially exposed to the hydrogen ($H_2$) plasma, and then exposed to the plasma composed of $SF_6$ and Ar. In this radical and ion-driven sequential plasma, about one hundred thirty eight (138) Angstroms are etched from the silicon nitride.

Figure 4:
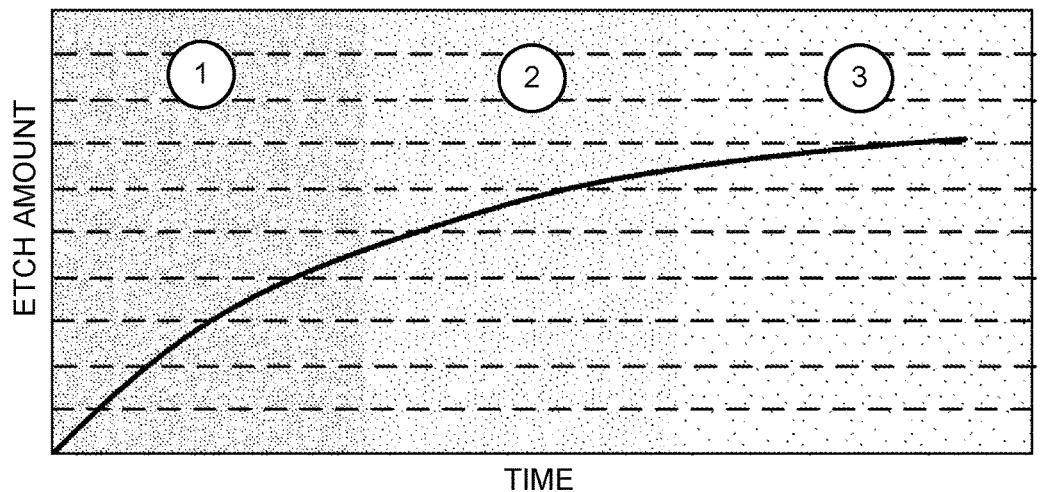
FIGS. 4 and 5 illustrate additional results obtained using the method of etching depicted in FIGS. 1 and 2.
Figure 5:
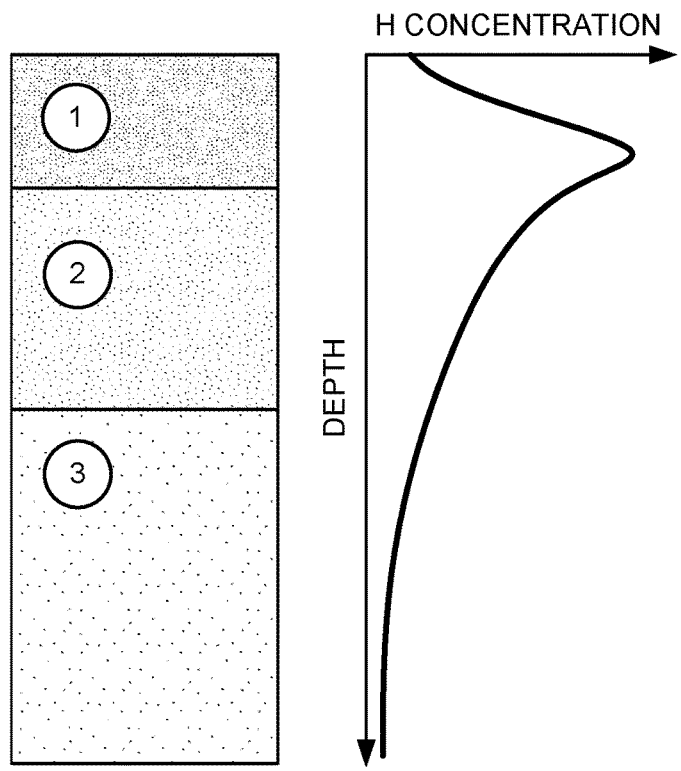

The inventors surmise that hydrogen ions during the hydrogen plasma step enrich a surface region of the silicon nitride and the silicon oxide, leading to elevated sub-surface hydrogen concentrations; see FIGS. 4 and 5. As shown in FIG. 5, the hydrogen content increases in region 1 (heavily modified sub-surface region) to a maximum, then decays through moderate concentration levels in region 2 (moderately modified sub-surface region), until it decays to low levels in region 3 (pristine or original material). Then, the $NF_3$ and $O_2$ plasma, or $SF_6$ and Ar plasma, creates radicals that selectively react with the hydrogenated silicon nitride and volatilize at a rate greater than with the second material, e.g., silicon oxide or organic material. FIG. 3 illustrates the etch amounts achieved with each exemplary process. And, as shown in FIG. 4, the etch amount achieved during the $NF_3$ and $O_2$, or $SF_6$ and Ar, step decreases (or the etch rate decays) as the etching proceeds through the sub-surface regions from relatively high hydrogen concentration to relatively low hydrogen concentration.

Figure 6A:
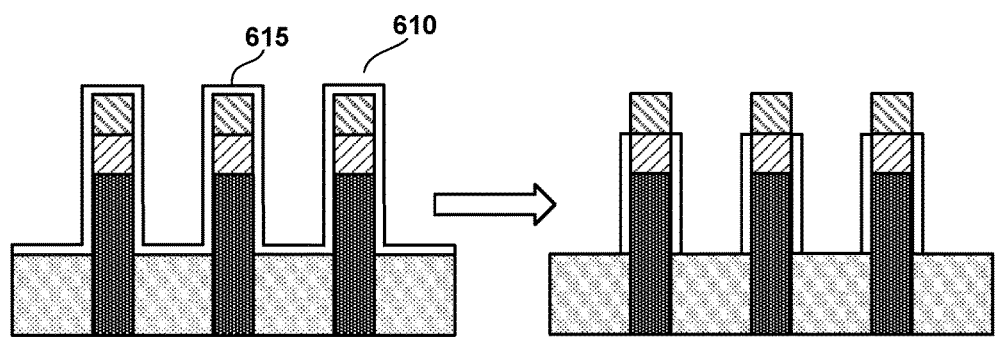
FIGS. 6A through 6D illustrate various exemplary fabrication sequences to which the method of etching depicted in FIGS. 1 and 2 can be applied according to several embodiments.
Figure 6B:
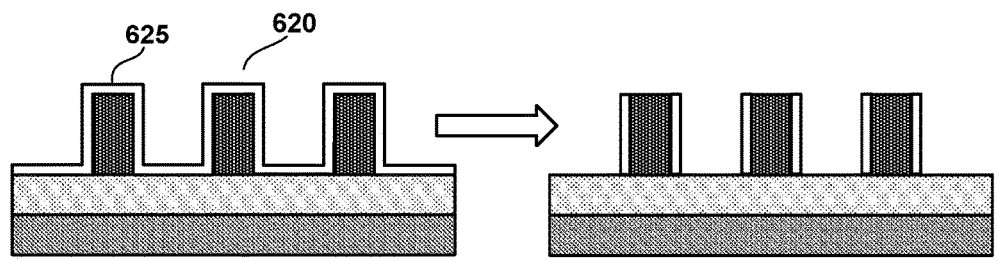
Figure 6C:
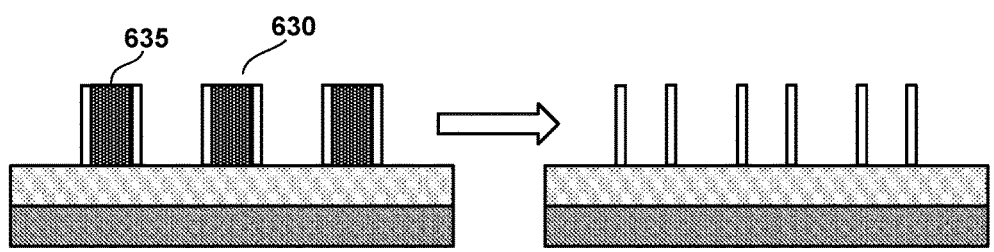
Figure 6D:
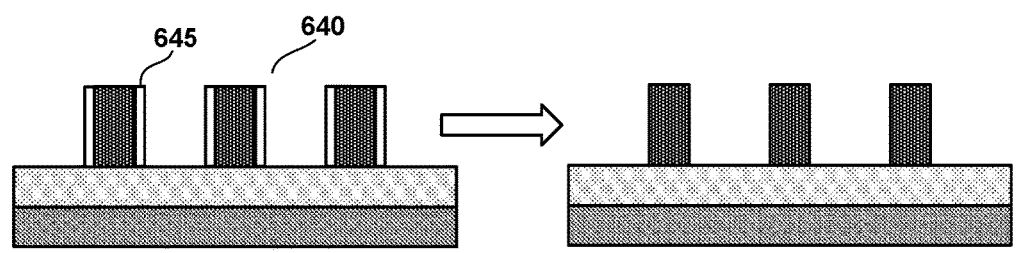

In FIGS. 6A through 6D, several examples of fabrication sequences in semiconductor manufacturing that demand precision etch techniques are provided. In each example, it is necessary to remove silicon nitride with high selectivity to other materials, and the examples include: (1) gate spacer etch for both 2D (two-dimensional) and 3D (three-dimensional) device structures, (2) spacer etch for sidewall image transfer (SIT) for multi-patterning, (3) mandrel removal from a post-spacer etch SIT structure, and (4) liner etch from a raised structure. FIG. 6A illustrates selectively removing a silicon nitride 615 from the cap region of the gate structure 610. FIG. 6B illustrates selectively removing a silicon nitride 625 from a cap region and footer region surrounding a mandrel 620 utilized in a self-aligned multi-patterning (SAMP) scheme. FIG. 6C illustrates selectively removing a silicon nitride mandrel 635 from a post-spacer etch structure 630 to leave behind double patterned spacer structures. FIG. 6D illustrates selectively removing silicon nitride liners 645 to leave behind a raised feature 640.

In yet another example, the fabrication of self-aligned block (SAB) structures has become a critical step in self-aligned double patterning (SADP), self-aligned quadruple patterning (SAQP), and other variations of self-aligned multiple patterning (SAMP). As part of an SAB flow, a silicon nitride mandrel is anisotropically etched with selectivity to an oxide spacer. Current approaches to etch silicon nitride mandrel do not have the required selectivity, which exceeds 15 (i.e., the etch rate of silicon nitride is 15 times greater than the etch rate of silicon oxide) to etch the mandrel without damaging the oxide spacer.

Figure 7A:
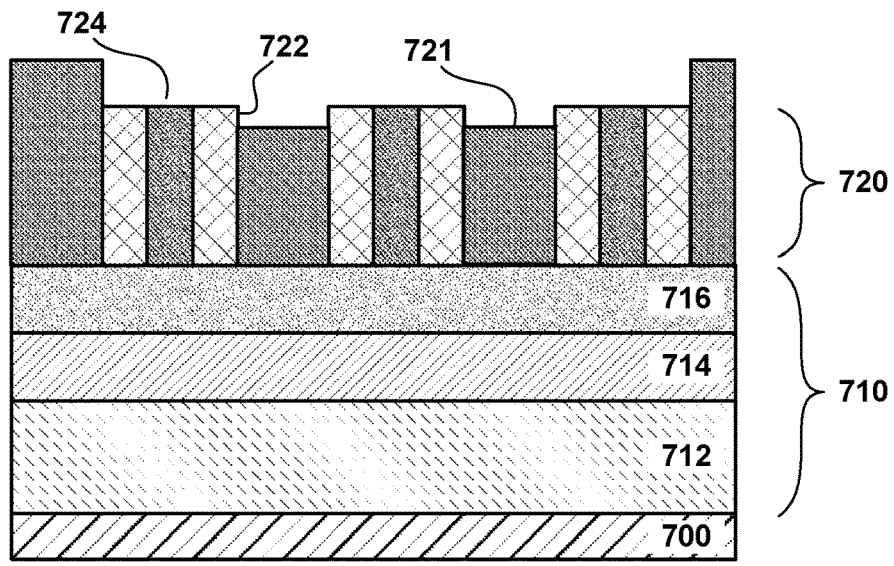
FIGS. 7A and 7B illustrate a schematic representation of a method of etching a thin film on a substrate according to another embodiment.

As shown in FIG. 7A, a substrate 700 can include a patterned layer 720 overlying a film stack 710, including one or more optional layers 712, 714, 716 to be etched or patterned. The patterned layer 720 can define an open feature pattern overlying one or more additional layers. The substrate 700 further includes device layers. The device layers can include any thin film or structure on the workpiece into which a pattern is to be transferred, or a target material is to be removed. Furthermore, the patterned layer 720 can include a retention layer 722, and a target layer 724 to be removed.

Figure 7B:
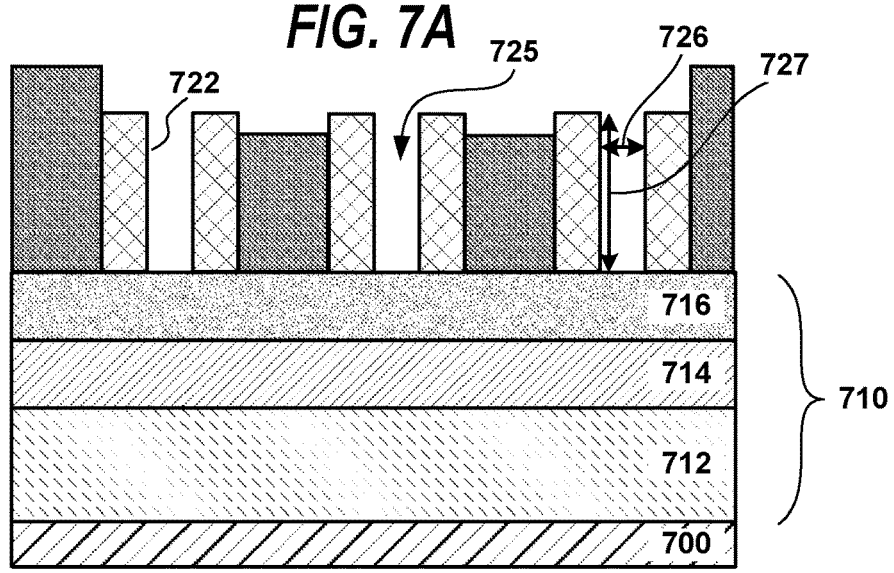

The target layer 724 can be composed of silicon nitride. As shown in FIGS. 7A and 7B, the target layer 724 fills a trench or via 725 within retention layer 722, the trench or via 725 has a depth (D) 727, a width (W) 726, and an aspect ratio (D/W). The aspect ratio can be greater than 3, 4, or 5. For some structures, the aspect ratio can be greater than 10, 15, or even 20. The width (W) 726 can be less than 50 nm, 40 nm, 30 nm, or 20 nm. In some applications, the width (W) 726 is less than 10 nm. The retention layer 722 can be composed of material selected from the group consisting of silicon oxide ($SiO_x$), silicon oxynitride ($SiO_xN_y$), transition metal oxide (e.g., titanium oxide ($TiO_x$)), transition metal nitride (e.g., titanium nitride ($TiN_y$)), and silicon-containing organic material having a silicon content ranging from 15% by weight to 50% by weight silicon.

As an example, the patterned layer 720 in FIG. 7A can include a spacer layer surrounding a mandrel layer used in multi-patterning schemes. Alternatively, for example, the patterned layer 720 in FIG. 7A can include a dummy silicon nitride layer filling a region to be replaced with an advanced gate structure, such as a metal gate structure.

The substrate 700 can include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate 700 can be of any size, for example, a 200 mm (millimeter) substrate, a 300 mm substrate, a 450 mm substrate, or an even larger substrate. The device layers can include any film or device structure into which a pattern can be transferred.

Organic layer 721 blankets various regions of substrate 700, and exposes block regions within which the silicon nitride mandrel is to be removed from high aspect ratio features. In FIG. 7B, the silicon nitride mandrel 714 is selectively removed with minimal impact to the silicon oxide spacers and the organic layer 721.

Figure 8:
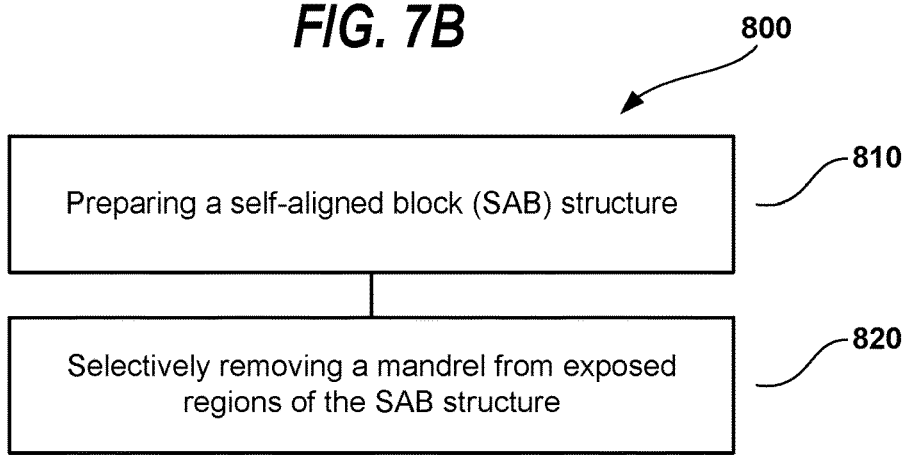
FIG. 8 provides a flow chart illustrating a method of etching a substrate according to yet another embodiment.

FIG. 8 depicts a flow chart 800 for etching a substrate according to another embodiment. In 810, a self-aligned block (SAB) structure is prepared. And, in 820, a mandrel is removed from an exposed region of the SAB structure. FIG. 8 depicts a method of selectively etching a silicon nitride mandrel from a high aspect ratio feature to leave behind silicon oxide spacers. The aspect ratio can exceed ten (10, and the etch selectivity for removing the silicon nitride mandrel relative to other materials, e.g., silicon oxide and organic material, can exceed 20-to-1, or 50-to-1, or even 100-to-1.

In the claims below, any of the dependents limitations can depend from any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/ or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of etching, comprising:
   providing a substrate having a first material containing silicon nitride and a second material that is different from the first material with the second material provided along first and second side walls of the first material such that the first material is between the second material on the first and second side walls and the first material fills a region between the second material on the first and second side walls;
   forming a first chemical mixture by plasma-excitation of a first process gas containing H and optionally a noble gas;
   exposing the first material on the substrate to the first chemical mixture to hydrogenate a surface and subsurface regions of the first material, the subsurface regions including a first portion and a second portion below the first portion, and after the exposing first material to the first chemical mixture the first portion has a hydrogen concentration greater than that at the surface and the second portion has a hydrogen concentration lower than that at the surface;
   thereafter, forming a second chemical mixture by plasma-excitation of a second process gas containing S and F, and optionally a noble element;
   exposing the first material on the substrate to the second plasma-excited process gas to selectively etch the first material relative to the second material; and
   repeating the exposing the first material to the first chemical mixture and the exposing the first material to the second plasma-excited process gas to remove the first material between the second material until a layer positioned under the first material is exposed, and after the layer positioned under the first material is exposed, the second material remains on the substrate.

2. The method of claim 1, wherein the first process gas contains $H_2$.

3. The method of claim 1, wherein the first process gas consists of $H_2$.

4. The method of claim 1, wherein the first process gas consists of $H_2$ and Ar.

5. The method of claim 1, wherein the second process gas contains $SF_6$ and Ar.

6. The method of claim 1, wherein the second process gas consists of $SF_6$ and Ar.

7. The method of claim 1, wherein the first chemical mixture contains hydrogen ions.

8. The method of claim 1, wherein the second chemical mixture contains substantially charge-neutral species.

9. The method of claim 1, wherein the second material is selected from the group consisting of SiO$_2$ and organic materials.

10. The method of claim 1, wherein the plasma excitation of the first process gas or the second process gas includes generating plasma using a capacitively coupled plasma source containing an upper plate electrode, and a lower plate electrode supporting the substrate.

11. The method of claim 1, wherein the plasma excitation of the first process gas or the second process gas includes generating plasma using an inductively coupled plasma source containing an inductive element, and a lower plate electrode supporting the substrate.

12. The method of claim 1, wherein the plasma excitation of the first process gas or the second process gas includes generating plasma using a remote plasma source that creates a high radical to ion flux ratio.

13. The method of claim 1, wherein the first material is removed at an etch selectivity of greater than 100-to-1 relative to the second material.

14. The method of claim 1, wherein the first material is a mandrel in a self-aligned multi-patterning (SAMP) process.

15. The method according to claim 1, further including:
performing the exposing the first material to the first chemical mixture in a processing chamber at a first pressure, performing the exposing the first material to the second plasma-excited process gas in the processing chamber at a second pressure, and the second pressure is greater than the first pressure; and
wherein the first process gas consists essentially of hydrogen and optionally a noble gas.

16. The method according to claim 15,
wherein during the exposing the first material to the first chemical mixture, a flow of fluorine containing gas to the processing chamber is turned off.

17. A method of etching, comprising:
providing a substrate having a first material containing silicon nitride and a second material that is different from the first material with the second material provided along first and second side walls of the first material such that the first material is between the second material on the first and second side walls and the first material fills a region between the second material on the first and second side walls;
forming a first chemical mixture by plasma-excitation of a first process gas containing H and optionally a noble gas;
exposing the first material on the substrate to the first chemical mixture to hydrogenate a surface and subsurface regions of the first material, the subsurface regions including a first portion and a second portion below the first portion, and after the exposing first material to the first chemical mixture the first portion has a hydrogen concentration greater than that at the surface and the second portion has a hydrogen concentration lower than that at the surface;
thereafter, forming a second chemical mixture by plasma-excitation of a second process gas containing a high fluorine content molecule, and optionally a noble element, wherein the ratio of fluorine to other atomic elements of the high fluorine content molecule exceeds unity;
exposing the first material on the substrate to the second plasma-excited process gas to selectively etch the first material relative to the second material; and
repeating the exposing the first material to the first chemical mixture and the exposing the first material to the second plasma-excited process gas to remove the first material between the second material until a layer positioned under the first material is exposed, and after the layer positioned under the first material is exposed, the second material remains on the substrate.

18. The method according to claim 17, further including:
performing the exposing the first material to the first chemical mixture in a processing chamber at a first pressure, performing the exposing the first material to the second plasma-excited process gas in the processing chamber at a second pressure, and the second pressure is greater than the first pressure; and
wherein the first process gas consists essentially of hydrogen and optionally a noble gas.

19. The method according to claim 18,
wherein during the exposing the first material to the first chemical mixture, a flow of fluorine containing gas to the processing chamber is turned off.

* * * * *